United States Patent [19]

Black et al.

[11] Patent Number: 4,756,927
[45] Date of Patent: Jul. 12, 1988

[54] METHOD AND APPARATUS FOR REFRACTORY METAL DEPOSITION

[75] Inventors: Jerry G. Black, Lincoln; Daniel J. Ehrlich, Lexington, both of Mass.

[73] Assignee: Massachusetts Institute of Technology, Cambridge, Mass.

[21] Appl. No.: 868,615

[22] Filed: May 29, 1986

[51] Int. Cl.$^4$ ............ B05D 3/06; B32B 35/00; C23C 16/00

[52] U.S. Cl. .............. 427/53.1; 427/253; 427/140

[58] Field of Search ............ 427/53.1, 253, 140

[56] References Cited

U.S. PATENT DOCUMENTS

| | | | |
|---|---|---|---|
| 4,404,235 | 9/1983 | Tarng et al. | 427/253 |
| 4,505,949 | 3/1985 | Jelks | 427/38 |
| 4,508,749 | 4/1985 | Brannon et al. | 427/54.1 |
| 4,540,607 | 9/1985 | Tsao | 427/253 |
| 4,543,270 | 9/1985 | Oprysko et al. | 427/53.1 |
| 4,568,565 | 2/1986 | Gupta et al. | 427/93 |
| 4,579,750 | 4/1986 | Bowen et al. | 427/53.1 |
| 4,624,736 | 11/1986 | Gee et al. | 427/53.1 |
| 4,654,223 | 3/1987 | Araps et al. | 427/54.1 |
| 4,656,050 | 4/1987 | Araps et al. | 427/54.1 |

OTHER PUBLICATIONS

Lo et al, "A CVD Study of the Tungsten-Silicon System", Chemical Vapor Deposition, 4th intern. conference.
"Direct-Write Metallization of Silicon MOSFETs Using Laser Photodeposition", *IEEE Electron Device Lett.*, vol. EDL-5, p. 32, 1984, Tsao et al.
"CVD Tungsten and Tungsten Silicide for VLSI Applications", *Semiconductor International*, vol. 8, p. 306, 1985, Sachdev et al.
"Laser-Induced Selective Deposition of Tungsten on Silicon", *J. Vac. Sci. Technol.*, vol. B3, p. 1441, 1985, Liu et al.
"Wafer-Scale Laser Pantography: Physics of Direct Laser-Writing Micron-Dimension Transistors", *Laser-Controlled Chemical Processing of Surfaces*, 1984, Johnson et al.
"Vapor Deposited Tungsten as a Metallization and Interconnection Material for Silicon Devices", *RCA Review*, vol. 31, p. 360, 1970, Shaw et al.
"Comparison of Laser-Initiated and Thermal Chemical Vapor Deposition of Tungsten Films", *Appl. Phys. Lett.*, vol. 45, p. 623, Deutsch et al.
"Deposition of Metal Films by Laser-Controlled CVD", *4th Int. Conf. Chem. Vapor Dep.*, p. 196, (1973), Berg et al.
"Lower Pressure Chemical Vapor Deposition of Tungsten on Polycrystalline and Single Crystal Silicon via the Silicon Reduction", *J. Electrochem. Soc.*, vol. 141, p. 2702, 1984, Tsao et al.
"Interfacial Structure of Tungsten Layers Formed by Selective Low Pressure Chemical Vapor Deposition", *J. Electrochem. Soc.*, vol. 132, p. 444, 1985, Stacy et al.
"Structure of Selective Low Pressure Chemical Vapor-Deposited Films of Tungsten", *J. Electrochem. Soc.*, vol. 132, p. 1243, 1985, Green et al.
"Laser Microphoto Chemistry for Use in Solid-State Electronics", *IEEE J. Quantum Electronic* QE-16, p. 1233, 1980, Ehrlich et al.

*Primary Examiner*—John H. Newsome
*Assistant Examiner*—Marianne L. Padgett
*Attorney, Agent, or Firm*—Hamilton, Brook, Smith & Reynolds

[57] ABSTRACT

A laser induced direct writing pyrolysis of a refractory metal or metal silicide on substrates is described. Typical reactants comprise flowing $WF_6$, $MoF_6$ or $TiCl_4$ with $SiH_4$ and an inert gas, such as Argon. A preferable substrate surface is a polyimide film. The refractory metal film may comprise low resistivity W, M, or Ti, or silicides thereof, having a predetermined resistance depending on the relative ratio of reactants. The invention is useful, inter alia, for repair of defective circuit interconnects, and formation of interconnects or resistors on substrates.

17 Claims, 4 Drawing Sheets

METHOD AND APPARATUS FOR REFRACTORY METAL DEPOSITION

The Government has rights in this invention pursuant to Contract Number F19628-85-C-0002 awarded by the Department of the Air Force.

BACKGROUND ART

In the manufacture of semiconductor integrated circuits, low resistance interconnection between circuit elements formed on or in the layers of the semiconductor material is essential. Generally, such interconnections are made as a step in the process of microcircuit fabrication utilizing well-known photolithographic masking, etching, and metal deposition techniques. In the past several years, direct writing of interconnects by local energy stimulus of a laser beam has been an active area of research. Such a technique is extremely useful for repairing defects or modifying existing integrated circuits to avoid the necessity for, and complexity involved in, conventional photolithography.

The most widely applied direct writing process has been the pyrolytic deposition of polysilicon from silane. When the silane gas is heavily doped with a material such as diborane, moderately conductive interconnects (500 microohm-cm at best) are deposited. This system has been applied to repair or modification of CMOS gate array circuits (Ehrlich et al. (1982)[1] and other electronic devices.

Many experimental approaches for directly depositing metals have been attempted in this time period. Most such approaches have been very slow due to chemical or optical limitations, or require use of exotic or highly toxic materials. In virtually every case the writing speed and/or the total thickness of the interconnect material is well below technologically useful values. In the case of polysilicon interconnects, the speed and thickness are adequate, but the conductivity is 2 decades below that of metals.

Tungsten and tungsten silicide have received increasing attention as Very Large Scale Integrated (VLSI) interconnection materials, owing to their low contact resistance to silicon, low susceptibility to electromigration, and high conductivity (6 and 70 microohms cm, respectively).[2]

There have been chemical vapor deposition processes (CVD) for creating layers of tungsten and its silicides for several years, for broad area coatings [for example, see Shaw and Amick (1970)][4] The growth rates are usually in the range of 100 nm/min (or roughly 6 micrometers/hr). Various attempts to bring these materials into the discretionary direct writing domain have been published. Berg & Mattox (1973)[5] deposited tungsten using an infrared laser and a $WF_6/H_2$ gas mix. In this case, the thicknesses were limited to 100 nm, and the laser power and resultant local heating were extremely high. In addition, good metallic conductivity was not obtained consistently unless high temperature furnace annealing followed laser-induced deposition. Deutsch & Rathman (1984)[5] performed a comparison of conventional CVD tungsten and an ultraviolet-laser enhanced deposition of this material. In their case, the laser was used in a broad fixed-spot mode, and again high temperatures were required to obtain low resistivity material. The growth rates/thicknesses were very similar to those stated above.

More recently, there has been activity in applying an interesting reaction wherein $WF_6$ reduces solid silicon[6-8], leaving a tungsten cladding over exposed silicon, but has no effect on background materials, such as $SiO_2$. This is a selective deposition reaction which forms tungsten on silicon by the silicon reduction of $WF_6$:

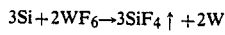

$$3Si + 2WF_6 \rightarrow 3SiF_4 \uparrow + 2W$$

This process has been extensively investigated [Tsao & Busta (1984)[6]], and many others, for use in improving the conductivity of polysilicon interconnects, which are frequently used in silicon devices. Herman et al. (1984)[3b], and Liu et al. (1985)[3a] have used the reaction to directly write tungsten coatings on bulk silicon, but the thickness is limited to 100 nm, and in most circuit applications, one requires electrical isolation between the silicon substrate and the interconnection metal to prevent shorting of circuit devices.

Therefore, despite the above intensive investigatory efforts, a suitable process for deposition of a low resistivity refractory metal pattern with good adherence on a substrate at high linear writing rates and at sufficiently low temperature to avoid damaging the substrate, has not been reported.

DISCLOSURE OF THE INVENTION

This invention relates, in general, to a catalyzed refractory metal process for depositing a low resistance refractory metal or a refractory metal silicide of predetermined resistance on a substrate in a reaction chamber. The refractory metal may be tungsten (W), molybdenum (Mo), or titanium (Ti). A flowing gaseous fluoride or chloride compound of the refractory metal and a silicon containing gas, such as silane ($SiH_4$), disilane ($Si_2H_6$) or dichlorosilane ($SiCl_2H_2$) are introduced into a reaction chamber. Photon energy from a laser beam is scanned across the substrate along the path in which the desired metal pattern is to be written. The energy from the laser beam is sufficient to initiate a reaction between the two reactant gases and localizes and guides the reaction, while the Si compound provides a catalyst to sustain the reaction resulting in deposition of the refractory metal along the path of the laser beam.

For deposits of greater than 200 nm thickness, we have found that it is essential that a proper substrate surface of an inert stress-relieving material, preferably a polyimide, be provided on the substrate to assure good adhesion of the refractory metal.

Suitable ratios of reactants, volumes of gases and ranges of laser scanning speed to provide optimum performance will now be explained in detail in connection with the drawings. In this explanation, the preferred Refractory Metal Gaseous (RMG) compound is $WF_6$ and the Si compound is silane, since most of our experiments were carried out with these materials. The process extends, however, to chemical analogues, such as silane/molybdenum hexafluoride or silane/titanium tetrachloride mixtures. Experimental results on the former yielded direct deposition by laser pyrolysis at rapid rates characteristic of the silane-activated binary reaction of the present invention. Other analogies contemplated include use of Ge-containing gaseous compounds, such as $GeH_4$ or $GeCl_2H_2$, in place of the Si-containing reactant gas.

BEST MODE FOR CARRYING OUT THE INVENTION

Figure 1A:
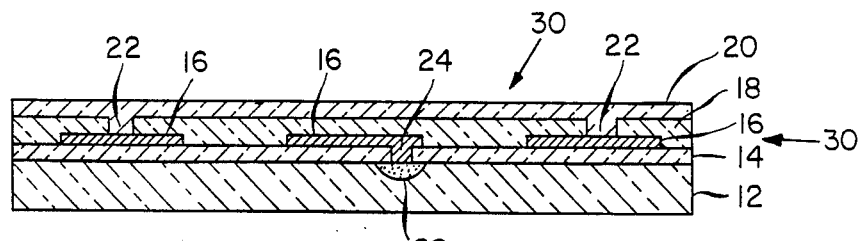
FIGS. 1(A–D) are cross-sectional views of semiconductor circuits showing how the process of the invention can be employed to write metal patterns (1A) or repair existing patterns (1B–C).
Figure 1B:
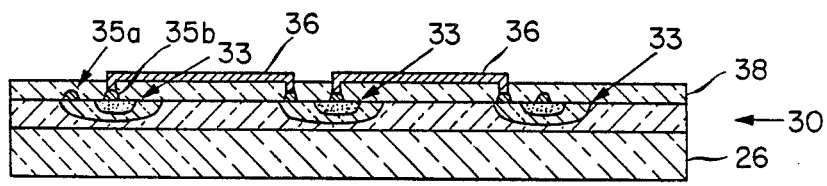
Figure 1C:
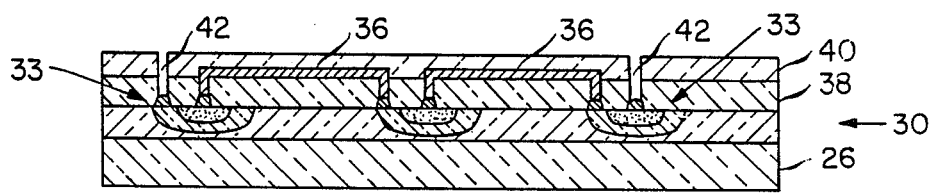
Figure 1D:
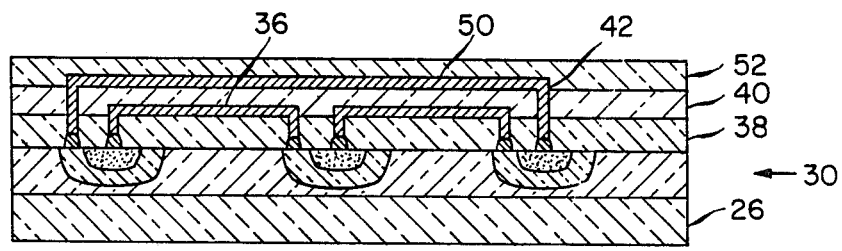

The apparatus for performing the laser induced CVD pyrolysis of the reactants employed in the present invention is similar to that described in previous direct-write laser applications (See D. J. Ehrlich et al., "Laser Microphoto Chemistry For Use In Solid-State Electronics", *IEEE J. Quantum Electronic* QE-16 p. 1233, 1980). A 488-nanometer Argon-ion laser was used in the experiments in which rapidly flowing $SiH_4/WF_6$ mixture, with inert gas (Argon) buffering is coupled into a reaction chamber, such as a deposition cell, in which a substrate is provided. The substrate deposition surface is disposed perpendicular to the focused Argon-ion laser beam which enters the reaction chamber through a light transparent window. The reactant gases flow past the focused beam. The laser beam is fixed in space and the substrate and chamber are precisely moved in relation to the beam in the path of the desired deposition pattern. The gas flow is electronically controlled and ample exhaust dilution and continuous vacuum oil filtering are employed to eliminate explosive reactions. Typically, the pressure was maintained in the order of 380 torr, and gas flows in the order of 0.4 sccm $SiH_4$, 1 sccm $WF_6$ and 10 sccm Argon.

In our early experiments using $SiH_4$ and a flowing $WF_6$ inert gas mixture, under certain conditions, the deposits, or at least their margins, were metallic in appearance. These shiny films were very thin, similar to that seen in older laser-CVD works, as opposed to the main deposit, which was deposited at very rapid rates (1 micrometer in 20 milliseconds). It was also noted that the laser power required to initiate this process was a decade below that needed for polysilicon deposition on similar substrates. The major flaw in the experimental material was its adhesion to the substrate. The fluorine, or fluorides which result from the pyrolysis attack silicon oxide and silicon nitride substrates. These materials also have little elasticity at the reduced surface temperatures (about 175° C.) encountered at the low laser powers utilized in the process, i.e., about 40 mW.

We therefore searched for a material which would have the requisite stress relieving properties at this relatively low temperature and still be sufficiently inert to resist degradation by attack from the volatile fluorines or fluorides produced in the reaction. In a series of experiments, we explored the use of $SiO_2$, $Si_3N_4$, and various organic polymer films for these purposes. Although polymer films were known to have potentially advantageous properties for stress relief and inertness, it was found that when these films were laser irradiated in air or in a vacuum, they were degraded beyond use at laser power levels well below those required to initiate deposition. Nonetheless, we have found that when irradiated in a $WF_6/SiH_4$ ambient, one class of these materials, namely polyimide films, have excellent utility as intermediate dielectric layers for stress relief and protection of substrates from chemical attack. Apparently, the tungsten deposition reaction itself, or a coincident side reaction, prevents the degradation of these polyimide films at laser powers sufficiently high to permit this use.

This polyimide material may be spun-on and baked, similar to the technique for applying photoresist to substrates. It has gained increasing use in silicon and GaAs device processing due to its ease of use and chemical durability. The laser-direct-writing of tungsten on this material works extremely well, and has been repeatedly accomplished in our laboratory for several months with totally reproducible results. The polyimide's resilience compensates for the inherent stress between the tungsten and the underlying substrate, and protects the substrate from fluoride attack. The low laser power required for deposition (20 mW to 500 mW) leaves the polyimide undamaged. We have determined by temperature bias experiments that the initiation temperature for the reaction is in the range of 175°–225° C., and polyimide begins decomposing at 475° C. Substrates varying from silicon, to GaAs, glass, and even cast epoxy, have been successfully metallized using the new process. The use of polyimide also allows for multi-level interconnection.

As shown in FIG. 1A, a device 30 may be fabricated from a substrate 12 upon which a polyimide layer 14 is formed. The substrate may comprise any of the well-known integrated circuit materials requiring interconnections, such as GaAs, Si, and may even comprise glass or epoxy. A via hole 24 is formed through the polyimide 14 to provide connection to metal contact region 28 in substrate 12. A first tungsten layer pattern 16 is directly written on the polyimide, in accordance with the above-described process; and the via hole 24 is filled with tungsten connection zone 28 to pattern 16. Next, pattern 16 is overcoated with a second polyimide layer 18 and a second metal layer pattern 20 is laser-written, in accordance with the invention. Layer 20 either crosses the first metal without electrical contact, or connects with the first metal thorugh a laser-ablated via hole 22. Such two level interconnections are essential in integrated circuits of all but the most trivial complexity, unless unusual provisions are made in designs to allow use of only one metal layer.

As shown in FIGS. 1(B–D), defective devices 30 fabricated in accordance with well-known prior art techniques, may be repaired in accordance with the process of the invention. Device 30 may, for example, comprise an integrated circuit in which p/n diodes 33 are formed in a well-known manner on a substrate 26, such as by diffusion of p and n doped silicon regions utilizing photolithography to define the diodes. Metal contacts 35 a,b are provided on the p and n diode elements, respectively; and a protective layer 38 of $SiO_2$ or $Si_3N_4$ is formed in a conventional manner over the interconnecting metal pattern 36.

Suppose, however, that one of the interconnecting patterns is defective or missing. This defect can be corrected by forming a polyimide film 40 over the $SiO_2$ layer 38 (FIG. 1C) and then opening via holes 42 to the portions of the circuit to be connected; for example, the n-contact of one diode 33a and the p-contact of another diode 33b. Next, FIG. 1D, the desired metal tungsten pattern 50 is written in accordance with the process, to fill in the via holes 42 and interconnect the two contacts. As optional encapsulating coating 52 may then be applied over the pattern 50. Alternatively, as will be described below, the pattern 50 may be made resistive by varying the ratio of $WF_6$ to $SiH_4$, thus producing precision resistors between elements.

To determine optimum process parameters for the direct laser induced writing process, certain parameters were varied in a controlled manner.

Figure 2:
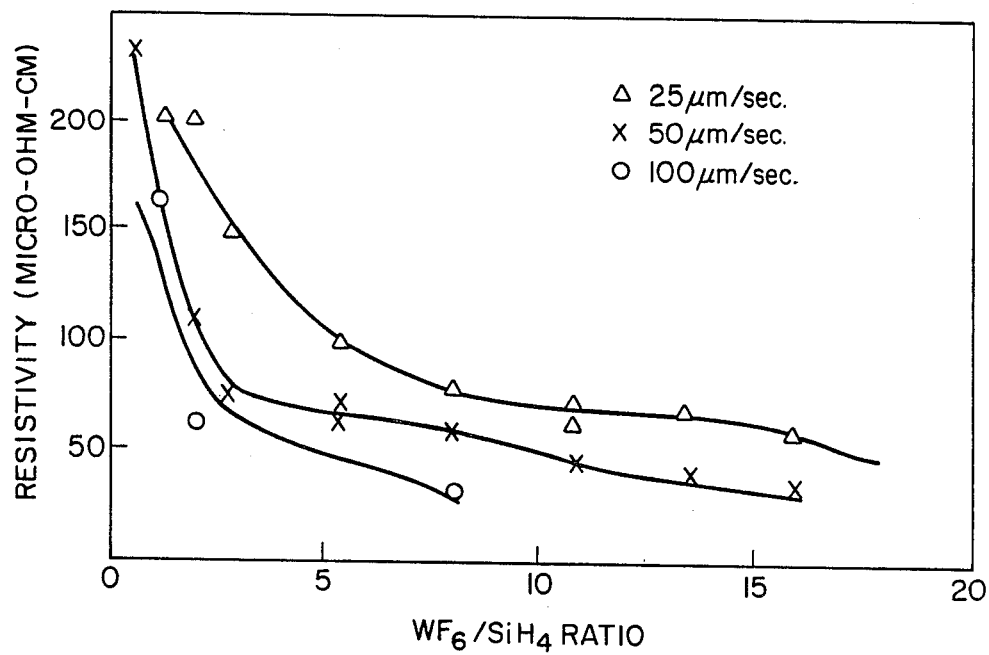
FIG. 2 is a plot of resistivity of the deposited pattern versus ratio of reactants ($WF_6/SiH_4$) at three different scanning speeds.

The parameter of greatest importance is the $WF_6/SiH_4$ ratio. FIG. 2 shows the bulk resistivity (in microohm-cm) plotted versus the W/Si ratio. As an additional parameter, the writing speed is varied from 25 $\mu$m/sec (curve "O") to 50 $\mu$m/sec (curve "+") to 100 $\mu$m (curve $\Delta$). The laser power in these experiments is also increased roughly proportionally to the speed increase to keep the deposition consistent between runs. Notable on this curve is the parabolic inverse relationship between the resistivity and the W/Si ratio. Also observed is the marked improvement in bulk conductivity with process speed. At higher speeds, the samples appear as specular metals, whereas at lower speeds, they appear dark, with a slightly rough surface.

Figure 3:
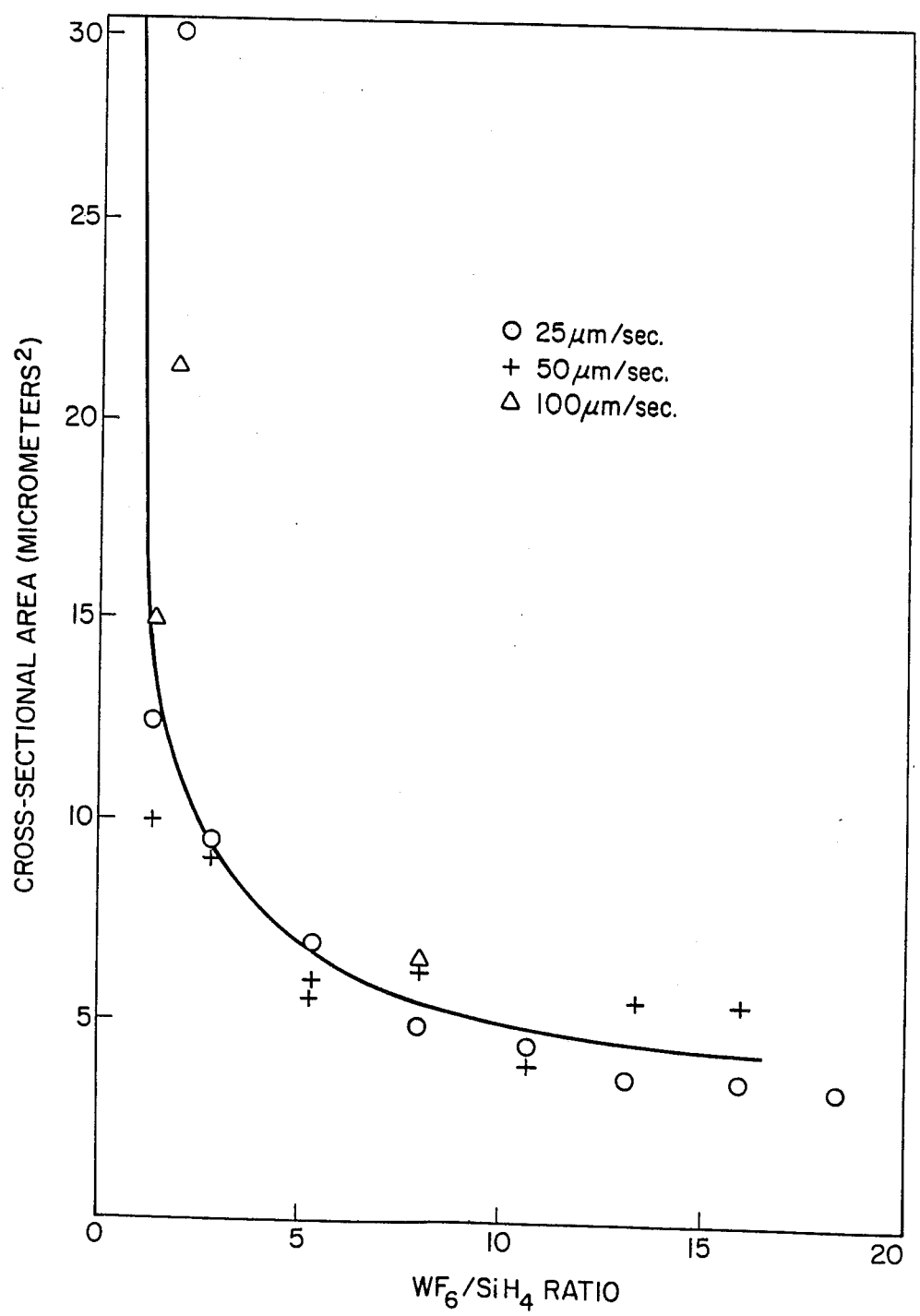
FIG. 3 is a plot of the cross-sectional area of the deposited pattern versus ratio of reactants ($WF_6/SiH_4$) at three different scanning speeds.

To ascertain the role of speed/composition in determining the amount of material deposited, the data in FIG. 2 is re-plotted in FIG. 3. From FIG. 3 it can be seen that the cross-sectional area of the deposited lines is essentially invariant with scan speed for a given W/Si ratio, so that it may be concluded that the intrinsic properties of the material are not immediately related to the size of the deposit.

Figure 4:
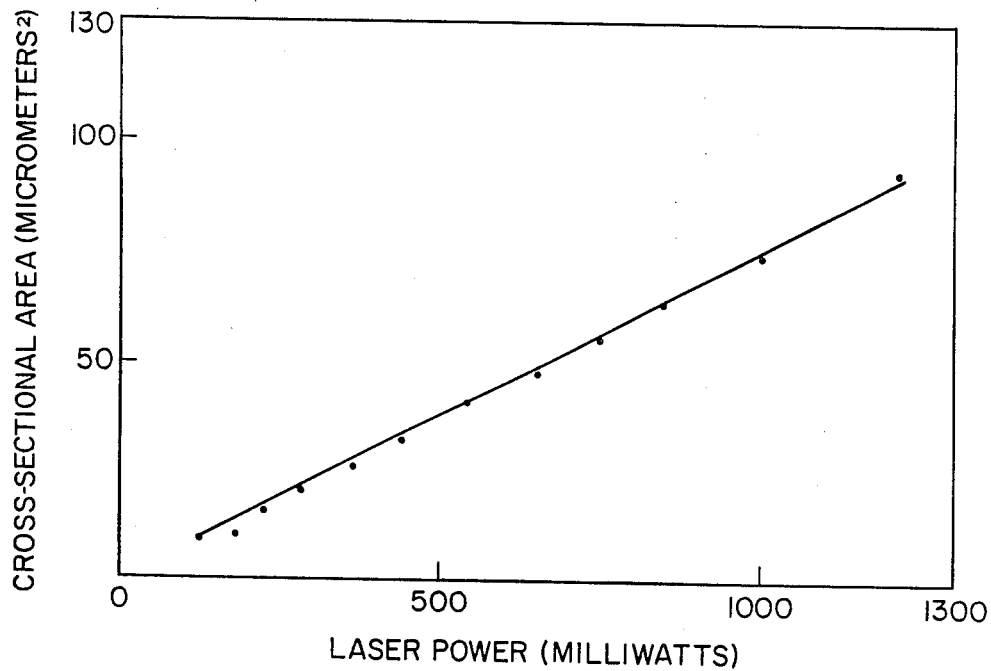
FIG. 4 is a plot of the cross-sectional area of the deposited pattern versus laser power for a fixed ratio (3:1) of reactants.

FIG. 4 is a plot at a fixed W/Si ratio (approximately 5:1) and a fixed laser scanning speed (50 micrometers/s). The resultant cross-sectional area of the deposits is shown to be linearly related to the laser power. Note that the optical efficiency of the experimental system is approximately 25 percent, so that maximum power on this line is approximately 300 milliwatts. In virtually every case, the process latitude is remarkably wide; speed or power variations of 20 percent generally represent no difficulty, and ultra-precise speed regulation in the sample or beam scanning is not required. This is a result of the self-driven nature of the deposition reaction.

Figure 5:
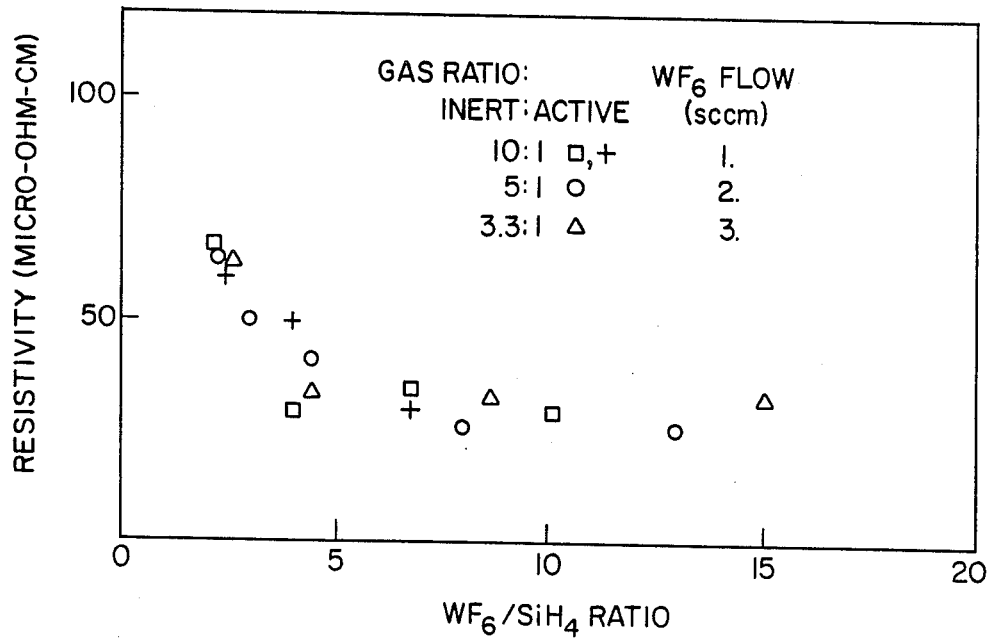
FIG. 5 is a plot of resistivity versus reactant ratio for three dilution values with a fixed gas flow rate.

The total "richness" of the gas mix appears not to be a critical parameter. FIG. 5 shows the resistivity versus W/Si ratio as before, the lines range over a factor of 3 in active/buffer gas concentrations. No significant effect is observed in this range. At extremely high buffer gas levels, the reaction is suppressed, and at very low levels, the risk of spontaneous reaction (explosion) is high. We have found that a nominal 10:1 buffer/active gas ratio is optimal.

By manipulating process conditions, we have obtained tungsten deposits with bulk resistivity down to 25 microohm-cm, which is about twice the usual value of thin film tungsten. We have also adjusted conditions by increasing the amount of Si (i.e., lower ratio of $WF_6$ to $SiH_4$) to obtain resistivities well above 100 microohm-cm, allowing direct deposition of resistors on polyimide. It should be noted that all of our results are obtained in the absence of any further annealing.

In a manner similar to the tungsten hexafluoride/silane laser-induced reaction described earlier, we have performed experiments to deposit molybdenum and titanium by employing a mixture of silane and the appropriate metal halide.

Using a flowing gas mixture at 380 torr absolute pressure, composed of 1 sccm (standard cubic centimeter/minute) $MoF_6$, 0.4 sccm $SiH_4$, and 10 sccm Ar, an opaque deposit was formed on a polyimide-coated silicon sample.

Similarly, an experiment using $TiCl_4$ and $SiH_4$ was undertaken. At 375 torr total pressure, 5 sccm of Ar was passed through a bubbler vial filled with $TiCl_4$, in order to carry its vapor to the reaction cell. 5 sccm Ar and 0.5 sccm $SiH_4$ were additionally mixed in. Under 488-nm laser irradiation on the substrate, an opaque deposit was formed.

Additionally, excimer laser radiation (ArF, wavelength=193 nm) was employed in the $WF_6/SiH_4$ deposition ambients, as well as the analogous Ti and Mo experiments. At a pulse repetition rate of 50 Hertz, the average power was adjusted to be in the range comparable to that used in the visible (Argon) laser cases described above. With a microscope system fitted with all-reflective optics, a focused spot was scanned as above. The deposition reaction took place in much the same manner as described above, with identical pressures and flows of the constituent gases.

Hybrid circuits were fabricated for direct-written tungsten interconnections. Indivudal components were mounted in a suitable carrier, such that the active surfaces were all coplanar (flush) with the carrier's top surface. The carrier may be a silicon wafer with photolithographically defined etched holes into which the components are placed, and then coated with polyimide, both for affixing the components, as well as providing the protective coating for the tungsten deposition process. Alternatively, we employed the technique of casting the components monolithically in a slab of epoxy, or alumina-filled epoxy, followed by the usual overcoat. The desired contact areas, or bonding pads, are cleared of polyimide, either photolithographically, or by using excimer laser radiation, to directly ablate the polyimide above the contact regions. The interconnection then proceeds as described above.

EQUIVALENTS

This completes the description of the preferred embodiments of the invention. Those skilled in the art will be able to devise modifications thereof without departing from the spirit and scope of the invention. For example, some integrated circuits presently employ a polyimide layer, therefore, the process of the invention will find direct applicability to the repair of defects on such circuits without the necessity of special substrate preparation. The substrate may be formed of many hybrid circuits or chips, separately fabricated and adhered to a carrier made of glass, semiconductor, ceramic, epoxy, or other suitable electrically insulating material.

Accordingly, the invention is not intended to be limited except as provided in the claims hereto.

(1) D. J. Ehrlich, J. Y. Tsao, D. J. Silversmith, J. H. C. Sedlacek, R. W. Mountain and W. S. Graber, "Direct-Write Metallization of Silicon MOSFETs Using Laser Photodeposition", *IEEE Electron Device Lett.*, Vol. EDL-5, pg. 32, 1984.

(2) S. Sachdev and R. Castellano, "CVD Tungsten and Tungsten Silicide for VLSI Applications", *Semiconductor International*, Vol. 8, pg. 306, 1985.

(3) (a) Y. S. Liu, C. P. Yakymyshyn, H. R. Phillipp, H. S. Cole, and L. M. Levinson, "Laser-Induced Selective Deposition of Tungsten on Silicon", *J. Vac. Sci. Technol.*, Vol. B3, pg. 1441, 1985. (b) I. P. Herman, B. M. McWilliams, F. Militsky, H. W. Chin, R. A. Hyde and L. L. Wood, "Wafer-Scale Laser Pantography: Physics of Direct Laser-Writing Micron-Dimension Transistors" in *Laser-Controlled Chemical Processing of Surfaces*, A. W. Johnson, D. J. Ehrlich, and H. R. Schlossbert, eds. New York: North-Holland, 1984.

(4) J. M. Shaw and J. A. Amick, "Vapor Deposited Tungsten as a Metallization and Interconnection Material for Silicon Devices", *RCA Review*, Vol. 31, pg. 306, 1970.

(5) R. S. Berg and D. M. Mattox, "Deposition of Metal Films by Laser-Controlled CVD", *4th Int. Conf. Chem. Vapor Dep.* pg 196 (1973), G. F. Wakefield and J. M. Blocker, eds.

(6) K. Y. Tsao and H. H. Busta, "Lower Pressure Chemical Vapor Deposition of Tungsten on Polycrystalline and Single Crystal Silicon via the Silicon Reduction", *J. Electrochem, Soc.* Vol. 141, pg. 2702, 1984.

(7) W. T. Stacy, E. K. Broadbent, and M. H. Norcott, "Interfacial Structure of Tungsten Layers Formed by Selective Low Pressure Chemical Vapor Deposition", *J. Electrochem. Soc.*, Vol. 132, pg. 444, 1985.

(8) M. L. Green and R. A. Levy, "Structure of Selective Low Pressure Chemical Vapor-Deposited Films of Tungsten", *J. Electrochem. Soc.*, VOl. 132, pg. 1243, 1985.

(9) T. F. Duetsch and D. D. Rathman, "Comparison of Laser-Initiated and Thermal Chemical Vapor Deposition of Tungsten Films", *Appl. Phys. Lett.*, Vol. 45, pg. 623, 1984.

We claim:

1. The method of forming a refractory metal pattern on a semiconductor substrate located within a reaction chamber comprising the steps of:
    (a) introducing a flowing gas mixture of two reactants and an inert gas into said chamber wherein the reactants comprise:
        (i) a refractory metal gaseous (RMG) compound, and a
        (ii) silicon (Si) or germanium (Ge) atom containing gaseous compound, and
        (iii) wherein the metal for the RMG compound is taken from the class comprising: W, Mo, Ti;
        (iv) the ratio by volume of RMG compound to Si or Ge containing gaseous compound is between about 1:1 and 20:1; and
    (b) subjecting said mixture to laser irradiation using a level of laser irradiation power directed toward said substrate and sufficient to initiate a localized reaction between the two reactants; with the Si or Ge compound providing a catalyst to sustain the reaction, resulting in the desired pattern being formed on said substrate by deposit of said refractory metal and wherein the temperature at which the reaction occurs and the refractory metal pattern is formed is below about 475° C.

2. The process of claim 1 wherein the substrate has an exposed polyimide surface upon which the pattern is formed.

3. The process of repairing interconnection defects in a substrate comprising the steps of:
    (a) forming a stress relieving protective layer on said substrate;
    (b) forming openings in the protective layer to points on the substrate which should be interconnected to repair the defect;
    (c) depositing a refractory metal in said openings and on said protective layer by low temperature pyrolysis at a temperature below 500° C. of a mixture of a flowing inert gas and a refractory metal gaseous compound and a silicon or germanium containing gaseous compound in a ratio by volume by greater than 1:1 refractory metal gaseous compound to silicon or germanium gaseous compound using a low power laser beam directed at the substrate to initiate and direct a localized reaction of said mixture to produce a refractory metal interconnection pattern.

4. The process of claim 3 wherein the substrate is a multi-chip or hybrid carrier comprised of glass, semiconductor, ceramic or epoxy material.

5. The method of forming a pattern of tungsten on a substrate located within a reaction chamber comprising the steps of:
    (a) introducing a flowing gas mixture of $WF_6$ and $SiH_4$ and an inert gas; and
    (b) subjecting said mixture to laser irradiation using a level of laser irradiation power sufficient to initiate a localized reaction between the $WF_6$ and $SiH_4$ with the $SiH_4$ providing a catalyst to sustain the localized reaction, resulting in the desired pattern of low resistivity metal tungsten being formed on said substrate and wherein the ratio of $WF_6$ to $SiH_4$ is at least 1:1 or higher by volume and the reaction occurs at temperatures below 500° C.

6. The process of claim 3 wherein the protective layer comprises a polyimide.

7. The method of claim 5 wherein the ratio by volume of $WF_6$ to $SiH_4$ is between about 1:1 and 20:1.

8. The process of providing interconnections for regions formed in a substrate comprising the steps of:
    (a) forming a polyimide layer on said substrate;
    (b) forming openings to regions of the substrate to be interconnected;
    (c) depositing a refractory metal in said openings and on said polyimide layer by low temperature pyrolysis at a temperature below 500° C. of a mixture of an inert gas and $WF_6$, $MoF_6$ or $TiCl_4$ and an Si containing gaseous compound using a low power laser beam directed at the substrate to initiate and direct a localized reaction of said mixture to produce a non-silicide, refractory metal interconnection pattern.

9. The method of forming a refractory metal pattern on a semiconductor substrate located within a reaction chamber comprising the steps of:
    (a) introducing a flowing gas mixture of two reactants and an inert gas wherein the reactants comprise:
        (i) a refractory metal gaseous compound, and a
        (ii) a silicon or germanium atom containing gaseous compound, and
        (iii) wherein the refractory metal gaseous compound is taken from the class comprising: W, Mo, Ti fluorides or chlorides; and
    (iv) the ratio by volume of the silicon or germanium compound compared to the refractory metal compound is 1:1 or less; and
    (b) imparting sufficient light energy to the reactants from a beam of light directed at the substrate surface upon which the metal pattern is to be formed to initiate a localized reaction between the two reactants; with the Si or Ge atom containing gaseous compound providing a catalyst to sustain the reaction, resulting in the desired pattern being formed on said substrate by deposit of a refractory metal pattern at a temperature below 500° C.

10. The process of claim 9 wherein the substrate has an exposed polyimide surface upon which the pattern is formed.

11. The process of claim 9 wherein the energy is imparted by a laser and the refractory metal gaseous compound is a metal fluoride or chloride compound containing a metal from the class of W, Mo or Ti and the pressure in the chamber during the reaction is in excess of 100 Torr.

12. The process of repairing interconnection defects by forming an interconnection metal pattern on a substrate comprising the steps of:
(a) forming a stress relieving protective layer on said substrate;
(b) forming openings in the protective layer to regions on a substrate which should be interconnected to repair the defect;
(c) depositing a low resistivity refractory metal in said openings and on said protective layer by localized low temperature pyrolysis at a temperature below 500° C. of a mixture of a flowing inert gas and a refractory metal gaseous compound and a semiconductor containing gaseous compound using low power laser energy directed at the substrate surface upon which the pattern is to be formed to initiate and direct the interconnection pattern.

13. The process of claim 12 wherein the sbustrate is a multi-chip or hybrid carrier comprised of glass, semiconductor, ceramic or epoxy material.

14. The process of claim 12 wherein the protective layer is comprised of a polyimide.

15. The method of forming a pattern of tungsten on a substrate located within a reaction chamber comprising the steps of:
(a) introducing a flowing gas mixture of $WF_6$ and $SiH_4$ having a ratio by volume of $WF_6$ to $SiH_4$ which is equal to or greater than about 1:1 and an inert gas; and
(b) subjecting said mixture to sufficient power from a laser beam directed at the substrate to initiate a localized reaction at a temperature below 500° C. between the $WF_6$ and $SiH_4$, with the $SiH_4$ providing a catalyst to sustain the reaction, resulting in the desired metal pattern of tungsten being formed on said substrate.

16. The method of claim 15 wherein the resistivity of the metallic pattern of W is about 150 micro-ohm-cm or less.

17. The process of providing interconnections for regions formed in a substrate comprising the steps of:
(a) forming a polyimide layer on said substrate;
(b) forming openings to the substrate to regions to be interconnected;
(c) depositing a refractory metal in said openings and on said polyimide by localized low temperature pyrolysis at a temperature below 500° C. of a mixture of an inert gas and $WF_6$, $MoF_6$ or $TiCl_4$ and an Si containing gaseous compound using a low energy laser pulse directed at the interconnections.

* * * * *

UNITED STATES PATENT AND TRADEMARK OFFICE
CERTIFICATE OF CORRECTION

PATENT NO. : 4,756,927
DATED : 7/12/88
INVENTOR(S) : Jerry G. Black and Daniel J. Ehrlich It is certified that error appears in the above—identified patent and that said Letters Patent is hereby corrected as shown below:

Column 8, line 9, second occurrence, delete "by" and insert ---of---.

Column 10, line 1, delete "sbustrate" and insert ---substrate---.

Signed and Sealed this

Thirteenth Day of December, 1988

Attest:

DONALD J. QUIGG

Attesting Officer

Commissioner of Patents and Trademarks